United States Patent
Lin et al.

(10) Patent No.: US 9,471,744 B2
(45) Date of Patent: *Oct. 18, 2016

(54) TRIPLE-PATTERN LITHOGRAPHY LAYOUT DECOMPOSITION

(71) Applicant: Taiwan Semiconductor Manufacturing Co., Ltd., Hsin-Chu (TW)

(72) Inventors: Hung Lung Lin, Hsinchu (TW); Chin-Chang Hsu, Banqiao (TW); Min-Yuan Tsai, Zhubei (TW); Wen-Ju Yang, Hsinchu (TW); Chien Lin Ho, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/819,590

(22) Filed: Aug. 6, 2015

(65) Prior Publication Data

US 2015/0379189 A1    Dec. 31, 2015

Related U.S. Application Data

(63) Continuation of application No. 14/302,684, filed on Jun. 12, 2014, now Pat. No. 9,122,838, which is a continuation-in-part of application No. 13/953,767, filed on Jul. 30, 2013, now Pat. No. 8,875,065.

(60) Provisional application No. 61/986,675, filed on Apr. 30, 2014, provisional application No. 61/835,267, filed on Jun. 14, 2013.

(51) Int. Cl.
*G06F 17/50* (2006.01)
*G03F 7/00* (2006.01)

(52) U.S. Cl.
CPC ........ *G06F 17/5081* (2013.01); *G03F 7/0035* (2013.01); *G06F 17/509* (2013.01)

(58) Field of Classification Search
CPC . G06F 17/5081; G06F 17/509; G03F 7/0035
See application file for complete search history.

(56) References Cited

U.S. PATENT DOCUMENTS

| 6,779,166 B2 | 8/2004 | Vidhani |
| 8,111,901 B2 * | 2/2012 | Nikolsky ............ G03F 7/70283 382/147 |
| 8,448,100 B1 | 5/2013 | Lin et al. |
| 8,473,874 B1 | 6/2013 | Sharma et al. |

(Continued)

OTHER PUBLICATIONS

Shao-Yun et al.; "A Novel Layout Decomposition Algorithm for Triple Patterning Lithography"; Design Automation Conference (DAC); 49th ACM/EDAC/IEEE; Jun. 3-7, 2012, San Francisco, California, USA; pp. 1181-1186.*

*Primary Examiner* — Naum B Levin
(74) *Attorney, Agent, or Firm* — Duane Morris LLP

(57) ABSTRACT

Provided is a method for evaluating and decomposing a semiconductor device level for triple pattern lithography in semiconductor manufacturing. The method includes generating a conflict graph and simplifying the conflict graph using various methods to produce a simplified conflict graph which can either be further simplified or evaluated for decomposition validity. The disclosure also provides for applying decomposition validity rules to a simplified conflict graph to determine if the conflict graph represents a semiconductor device layer that is decomposable into three masks. Methods of the disclosure are carried out by a computer and instructions for carrying out the method may be stored on a computer readable storage medium.

19 Claims, 12 Drawing Sheets

(56) References Cited

U.S. PATENT DOCUMENTS

| | | |
|---|---|---|
| 8,484,607 B1 | 7/2013 | Tang et al. |
| 8,647,893 B1 | 2/2014 | Agarwal et al. |
| 8,677,297 B2 | 3/2014 | Chase et al. |
| 8,745,556 B2 * | 6/2014 | Chen .................. G06F 17/5072 430/5 |
| 8,875,065 B1 * | 10/2014 | Lin .................... G06F 17/5081 716/52 |
| 8,910,095 B2 * | 12/2014 | Li .......................... G06F 17/50 716/51 |
| 9,122,838 B2 * | 9/2015 | Lin ..................... G06F 17/5081 |
| 9,141,752 B2 * | 9/2015 | Lin ..................... G06F 17/5081 |
| 2011/0078638 A1 | 3/2011 | Kahng et al. |
| 2012/0216157 A1 | 8/2012 | Luo et al. |
| 2013/0074024 A1 | 3/2013 | Chase et al. |
| 2014/0245237 A1 * | 8/2014 | Cilingir ............... G03F 7/70433 716/51 |

* cited by examiner

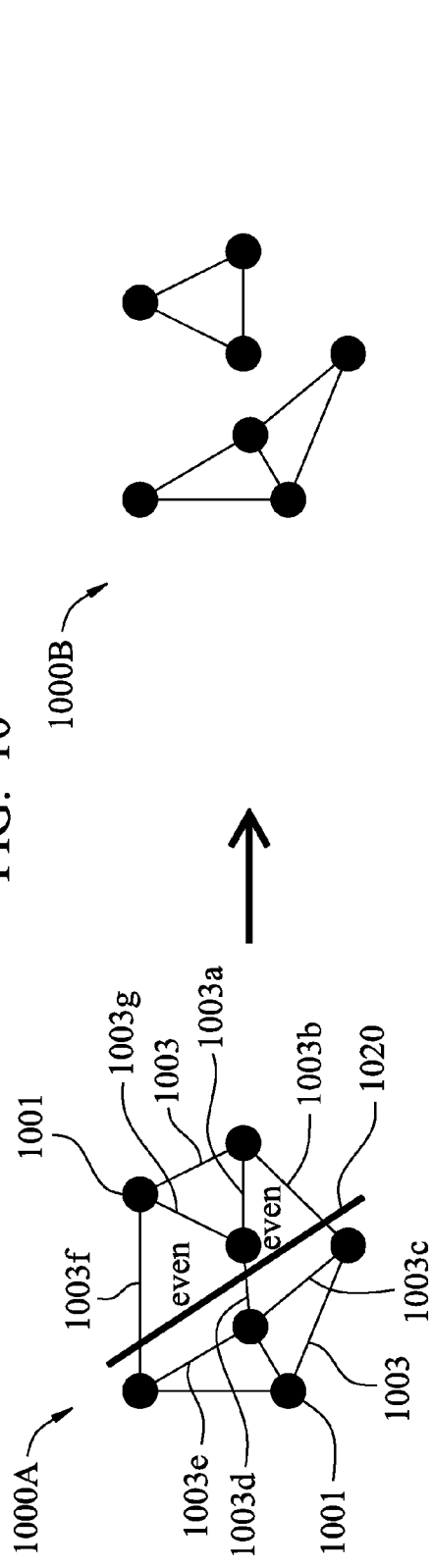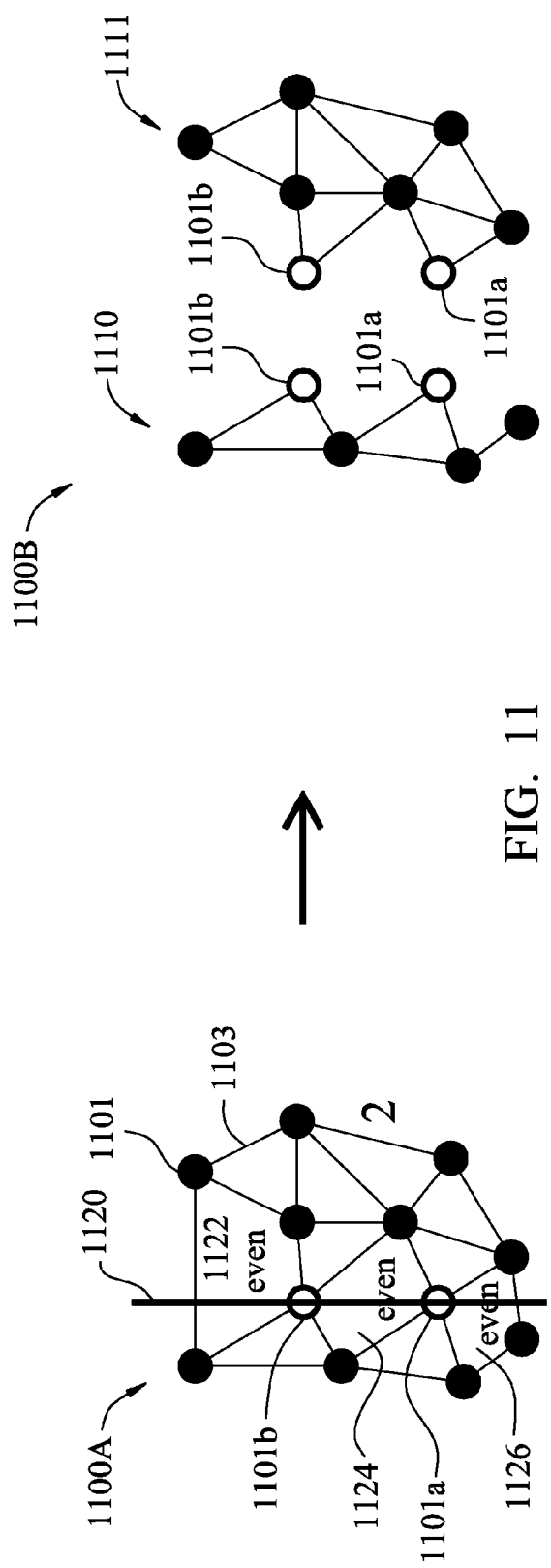
FIG. 10
FIG. 11

TRIPLE-PATTERN LITHOGRAPHY LAYOUT DECOMPOSITION

RELATED APPLICATIONS

This application is a continuation of U.S. patent application Ser. No. 14/302,684 filed Jun. 12, 2014, which claims priority to U.S. Provisional Application 61/986,675, filed Apr. 30, 2014 and which is a continuation-in-part of U.S. patent application Ser. No. 13/953,767 filed Jul. 30, 2013, which claims priority to U.S. Provisional Application No. 61/835,267, filed Jun. 14, 2013, the contents of each of which are expressly incorporated herein by reference, in their entireties.

BACKGROUND

This disclosure relates generally to the field of manufacture semiconductor integrated circuits using triple-pattern lithography (TPL), and more particularly to methods, systems, and computer program products validating triple-pattern lithography layout decomposition.

In semiconductor fabrication processes, the resolution of a photoresist pattern begins to blur at about 45 nanometers (nm) half pitch. In order to provide semiconductor layers with smaller distances between adjacent patterns, without resorting to such expedients as extreme ultra violet (EUV) technology, double-patterning has been developed. In double-patterning, the layout of a single layer of an integrated circuit (IC) is decomposed into two masks (alternatively referred to as "photomasks"). In double-patterning, there are two separate exposure and etching steps using each of the two masks separately. The advantages achieved with double-patterning have been extending using triple-patterning, wherein the layout is decomposed into three separate masks.

In multiple-patterning, such as double-patterning and triple-patterning, design rules provide that polygons of the layout (of the same device layer) that are separated from each other by less than a predetermined distance are not to be in the same mask. Graph theory has been applied to the analysis and validation of multiple-pattern decompositions. A given device layout can be represented as a conflict graph CG=(V, E), wherein each vertex V represents a polygon (i.e., a circuit pattern) of the layout and an edge E is formed connecting two vertices, when the distance between two corresponding polygons is less than a minimum separation distance for clearly exposed patterns using a single photomask. In graph theory, the vertices are also referred to more generally as nodes and the edges are alternatively referred to as links. A loop is the loop created by the edges connecting the vertices. A closed loop in a conflict graph with an even number of vertices can be decomposed into two masks. Accordingly, a decomposition violation in double-patterning can be detected by the presence of a loop with an odd number of vertices in the conflict graph. However, decomposition validation in triple-patterning is a much more complex problem. In fact, the problem is NP-complete, which makes the problem not solvable in a reasonable amount of time.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIG. 10 illustrates another method for simplifying a conflict graph to determine decomposition validation in accordance with various embodiments of the present disclosure.

FIG. 11 illustrates another method for simplifying a conflict graph to determine decomposition validation in accordance with various embodiments of the present disclosure.

DETAILED DESCRIPTION

The disclosure is related to triple-pattern lithography (TPL) in semiconductor and other manufacturing industries. The disclosure provides for generating a conflict graph representative of a layout of a semiconductor device and the conflict graph is evaluated to determine whether the conflict graph indicates that the layout can be decomposed into three masks for TPL. The disclosure further provides for simplifying the conflict graph using various methods and techniques to produce a simplified conflict graph. The simplified conflict graph can then be used to more easily determine whether the layout can be decomposed into three masks.

Figure 1A:
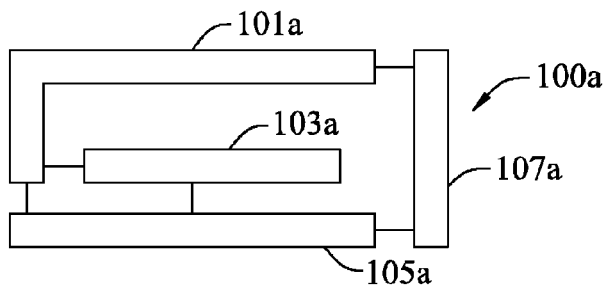
FIG. 1A is a top view of a layout in accordance with various embodiments of the present disclosure.

Referring now to the drawings, and first to FIG. 1A, a layout for a layer, i.e., a device level, of an integrated circuit, is designated generally by the numeral 100a. Layout 100a includes polygons 101a, 103a, 105a and 107a representing circuit patterns. As indicated by lines interconnecting various polygons 101a-107a, certain polygons are spaced apart from other polygons of layout 100a by less than a predetermined distance. In some embodiments, the predetermined distance is the minimum separation distance between patterns that can be clearly formed using a single photomask. Thus, polygon 101a is spaced less than the predetermined distance from polygons 103a, 105a and 107a; polygon 103a is spaced less than the predetermined distance from polygons 101a and 105a; polygon 105a is spaced less than the predetermined distance from polygons 101a, 103a and 107a; and polygon 107a is spaced less than the predetermined distance from polygons 101a and 105a. It will be understood that the interconnecting lines of FIG. 1A indicate only spacing and are not structural features of layout 100a.

Figure 1B:
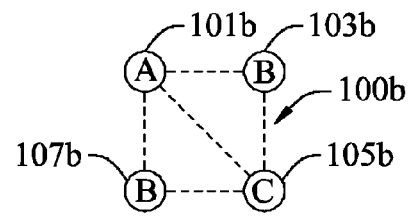
FIG. 1B is a conflict graph of the layout of FIG. 1A in accordance with various embodiments of the present disclosure.

According to some embodiments of the present disclosure, layout 100a can be represented by a conflict graph 100b, as shown in FIG. 1B. Conflict graph 100b comprises a set of vertices 101b, 103b, 105b, and 107b, which correspond to polygons 101a, 103a, 105a and 107a, respectively, of layout 100a, and edges, indicated by dashed lines in FIG. 1B, which correspond to the spacing of polygons 101a-107a of layout 100a indicated by the interconnecting lines shown and described in conjunction with FIG. 1A. Conflict graph 100b is generated by a computer or other processor according to various embodiments.

Throughout the disclosure, vertices may be referred to alternatively as nodes and edges may be referred to as links.

Figure 1C:
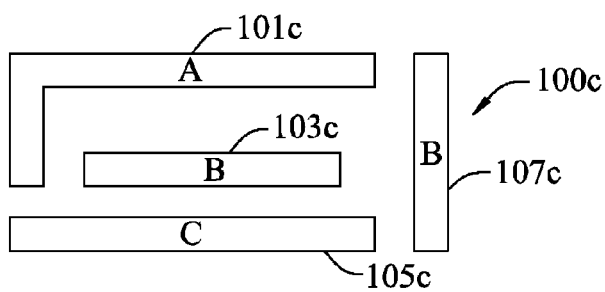
FIG. 1C is a triple-patterning decomposition of the layout of FIG. 1A in accordance with various embodiments of the present disclosure.

In some embodiments of the present disclosure, the three photomasks are designated A, B and C. As shown in FIG. 1B, vertex 101b is assigned to mask A, vertex 103b is assigned to mask B, and vertex 105b is assigned to mask C. The assignments are made by a computer or other suitable processor, according to some embodiments of the disclosure. Since vertex 107b shares edges with vertices 101b and 105b, vertex 107b must be assigned to mask B. Since no vertices in conflict graph 100b share edges with a vertex assigned to the same mask, layout 100 may be validly decomposed in accordance with conflict graph 100b. The decomposition is shown in FIG. 1C, wherein polygon 101c is assigned to mask A, polygons 103c and 107c are assigned to mask B, and polygon 105c is assigned to mask C. A computer or other suitable processor analyzes conflict graph 100b, analyzes whether or not conflict graph 100b may be validly decomposed and decomposes conflict graph 100b to produce the mask assignments shown in FIG. 1C. It should be understood that a computer or other suitable processor is used to carry out these steps in conjunction with the various methods and embodiments of the disclosure.

Figure 2A:
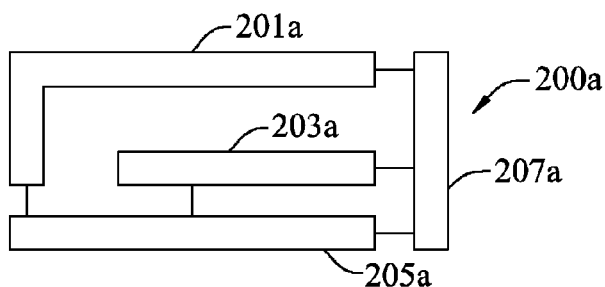
FIG. 2A is a top view of a second layout in accordance with various embodiments of the present disclosure.

Referring now to FIG. 2A, a layout for a second layer of an integrated circuit is designated generally by the numeral 200a. Layout 200a includes polygons 201a, 203a, 205a and 207a. Polygon 201a is spaced less than the predetermined distance from polygons 205a and 207a; polygon 203a is spaced less than the predetermined distance from polygons 205a and 207a; polygon 205a is spaced less than the predetermined distance from polygons 201a, 203a and 207a; and polygon 207a is spaced less than the predetermined distance from polygons 201a, 203a and 205a.

Figure 2B:
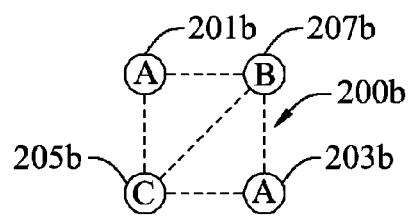
FIG. 2B is a conflict graph of the layout of FIG. 2A in accordance with various embodiments of the present disclosure.

As shown in FIG. 2B, layout 200a is represented by a conflict graph 200b. Conflict graph 200b comprises a set of vertices 201b, 203b, 205b, and 207b, which correspond to polygons 201a, 203a, 205a and 207a, respectively, of layout 200a, and edges, indicated by dashed lines in FIG. 2B, which correspond to the spacing of polygons 201a-207a of layout 200a.

Figure 2C:
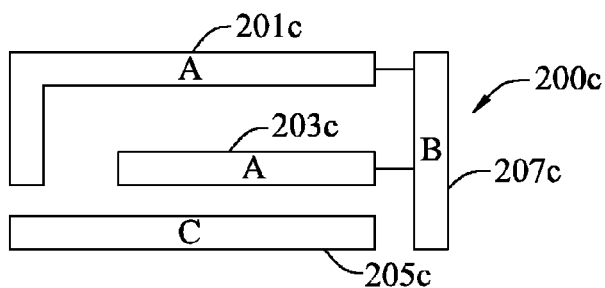
FIG. 2C is a triple-patterning decomposition of the layout of FIG. 2A in accordance with various embodiments of the present disclosure.

As shown in FIG. 2B, vertex 201b is assigned to mask A, vertex 207b is assigned to mask B, and vertex 205b is assigned to mask C. Since vertex 203b shares edges with vertices 205b and 207b, vertex 203b is assigned to mask A. Since no vertices in conflict graph 200b share edges with a vertex assigned to the same mask, layout 200 may be validly decomposed in accordance with conflict graph 200b. The decomposition is shown in FIG. 2C, wherein polygons 201c and 203c are assigned to mask A, polygon 207c is assigned to mask B, and polygon 205c is assigned to mask C.

Figure 3A:
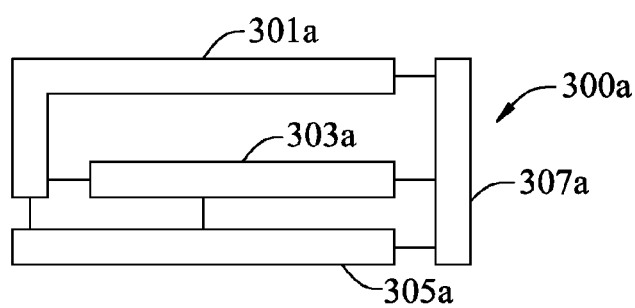
FIG. 3A is a top view of a third layout in accordance with various embodiments of the present disclosure.

Referring now to FIG. 3A, a third layout for a layer of an integrated circuit is designated generally by the numeral 300a. Layout 300a includes polygons 301a, 303a, 305a and 307a. Polygon 301a is spaced less than the predetermined distance from polygons 303a, 305a and 307a; polygon 303a is spaced less than the predetermined distance from polygons 301a, 305a and 307a; polygon 305a is spaced less than the predetermined distance from polygons 301a, 303a and 307a; and polygon 307a is spaced less than the predetermined distance from polygons 301a, 303a and 305a.

Figure 3B:
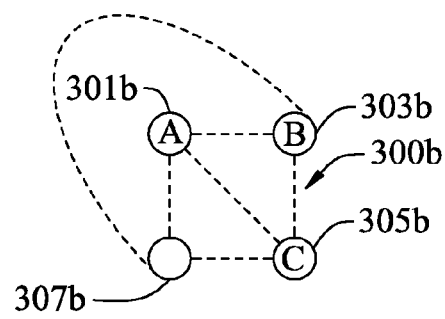
FIG. 3B is a conflict graph of the layout of FIG. 3A in accordance with various embodiments of the present disclosure.

As shown in FIG. 3B, layout 300a is represented by a conflict graph 300b. Conflict graph 300b comprises a set of vertices 301b, 303b, 305b, and 307b, which correspond to polygons 301a, 303a, 305a and 307a, respectively, of layout 300a, and edges, indicated by dashed lines in FIG. 3B, which correspond to the spacing of polygons 301a-307a of layout 300a.

As shown in FIG. 3B, if vertex 301b is assigned to mask A, vertex 303b is assigned to mask B, and vertex 305b is assigned to mask C, then vertex 307b cannot be assigned to any masks A, B, or C without resulting in a decomposition violation. Since each of the four vertices 301b-307b is connected by an edge to every other vertex in in conflict graph 300b, layout 300a cannot be validly decomposed into three masks. Accordingly, layout 300a must be redesigned before it can be validly decomposed.

Figure 4:
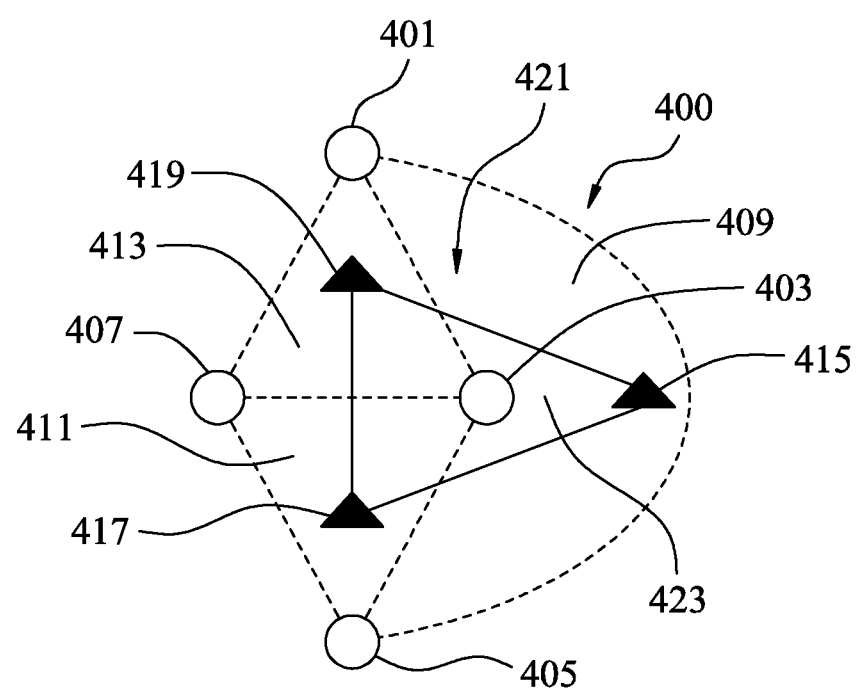
FIG. 4 illustrates a first conflict graph of a layout and a second conflict graph of the first conflict graph in accordance with various embodiments of the present disclosure.

Referring now to FIG. 4, a conflict graph is designated generally by the numeral 400. Conflict graph 400 includes vertices 401, 403, 405 and 407, connected by edges, indicated by dashed lines. As described with reference to FIGS. 3A and 3B, a layout corresponding to conflict graph 400 cannot be validly decomposed for triple-pattern lithography without conflicts.

Conflict graphs according to some embodiments of the present disclosure include loops. As used herein, a loop is an alternating sequence of vertices and edges that begin and end on the same vertex, with no repeated edge or vertex. Also, as used herein, a loop is "clear" or "open" in that it does not encompass any other edge or vertex of the conflict graph. Thus, conflict graph 400 includes a first loop 409, a second loop 411 and a third loop 413.

According to some embodiments of the present disclosure, each loop in a layout or first conflict graph is represented by one vertex in a second conflict graph, sometimes referred to below as a "Loop$^2$" conflict graph. Referring to FIG. 4, loop 409 is represented by a vertex 415, loop 411 is represented by a vertex 417, and loop 413 is represented by a vertex 419, of a Loop$^2$ conflict graph 421. Loop$^2$ vertices 415 and 417, which represent adjacent first conflict graph loops 409 and 411, respectively, are connected by an edge, indicated by a solid line. As used herein, first conflict graph loops are "adjacent" if they share a common first conflict graph edge. Loop$^2$ vertices 417 and 419, which represent adjacent first conflict graph loops 411 and 413, respectively, are connected by an edge. Finally, Loop$^2$ vertices 419 and 415, which represent adjacent first conflict graph loops 413 and 409, respectively, are connected by an edge.

Loop$^2$ vertices 415, 417, and 419, and their respective edges form a loop. According to some embodiments of the present disclosure, every triple-pattern lithograph decomposition violation in a layout is identified by a loop in a loop$^2$ conflict graph. Thus, loop$^2$ loop 423 in Loop$^2$ conflict graph 421 indicates that the layout represented by first conflict graph 400 is not decomposable.

Figure 5:
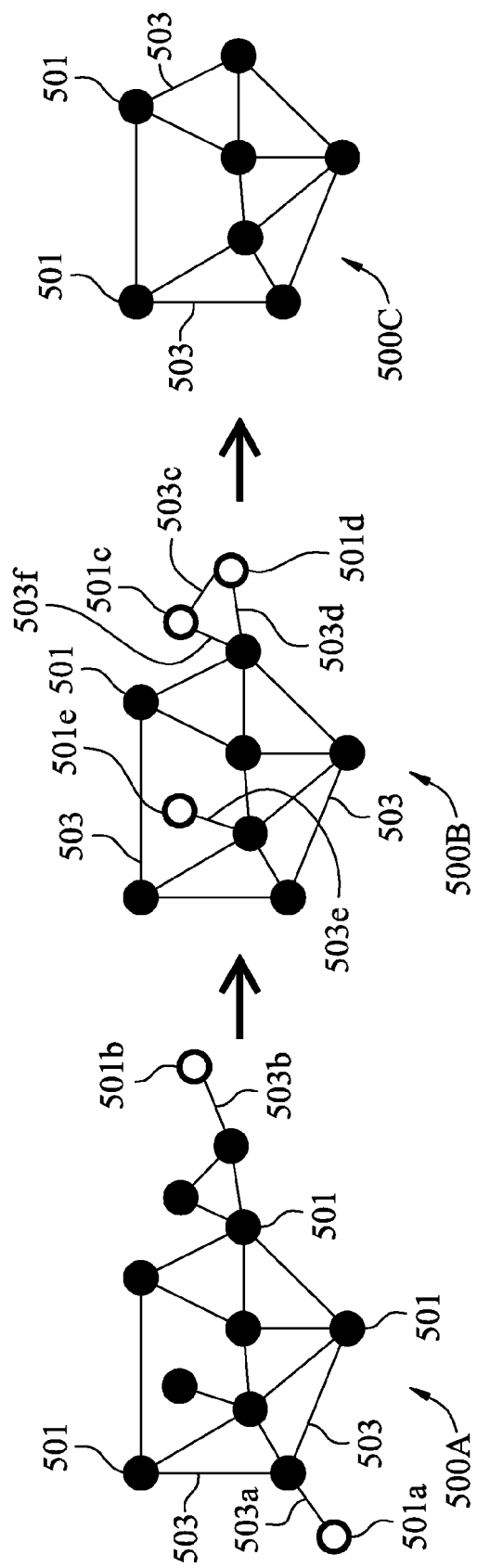
FIG. 5 illustrates a method for simplifying a conflict graph to determine decomposition validation in accordance with various embodiments of the present disclosure.

Referring now to FIG. 5, conflict graph 500A includes vertices 501 which each correspond to a polygon in a layer of a device layout, and edges 503. Edges 503 correspond to spacings between the polygons represented by vertices 501, that are spaced from each other by less than a predetermined distance, e.g. the minimum separation distance between patterns that can be clearly formed using a single photomask. Thus, each edge 503 represents that the vertices 501 connected by the edge 503, represent polygons in a device layout that are spaced from each other less than the predetermined distance and cannot be on the same photomask. The present disclosure provides for converting conflict graph 500A to a simplified conflict graph 500B. This is done by removing vertices 501 of the conflict graph 500A that are connected to two or fewer edges 503. The generation of conflict graph 500A and the simplification of conflict graph 500A to simplified conflict graph 500B is done by a computer or other suitable processor.

In FIG. 5, conflict graph 500A includes at least vertices 501a and 501b that are coupled to the conflict graph 500A by only one edge. According to embodiments of the disclosure, vertices that are coupled to the conflict graph by only two or fewer edges are removed. Vertex 501a is coupled to the conflict graph by only edge 503a and vertex 501b is coupled to conflict graph 500a by only edge 503b. According to the disclosure, these vertices 501a, 501b are removed from the conflict graph to produce simplified conflict graph 500B. Simplified conflict graph 500B includes vertices 501 and edges 503. Among vertices 501 and edges 503 in simplified conflict graph 500B are vertices that are coupled to the conflict graph by two or fewer edges. In simplified conflict graph 500B, vertex 501e is coupled to simplified conflict graph 500B by only edge 503e. Vertex 501c is coupled to simplified conflict graph 500B by only edges 503c and 503f. Vertex 501d is coupled to simplified conflict graph 500B by only edges 503c and 503d. According to an embodiment, vertices 501c, 501d and 501e are removed to produce simplified conflict graph 500C. Simplified graph 500C can now be further simplified by another method of the disclosure (see below), or evaluated for decomposition.

Figure 6:
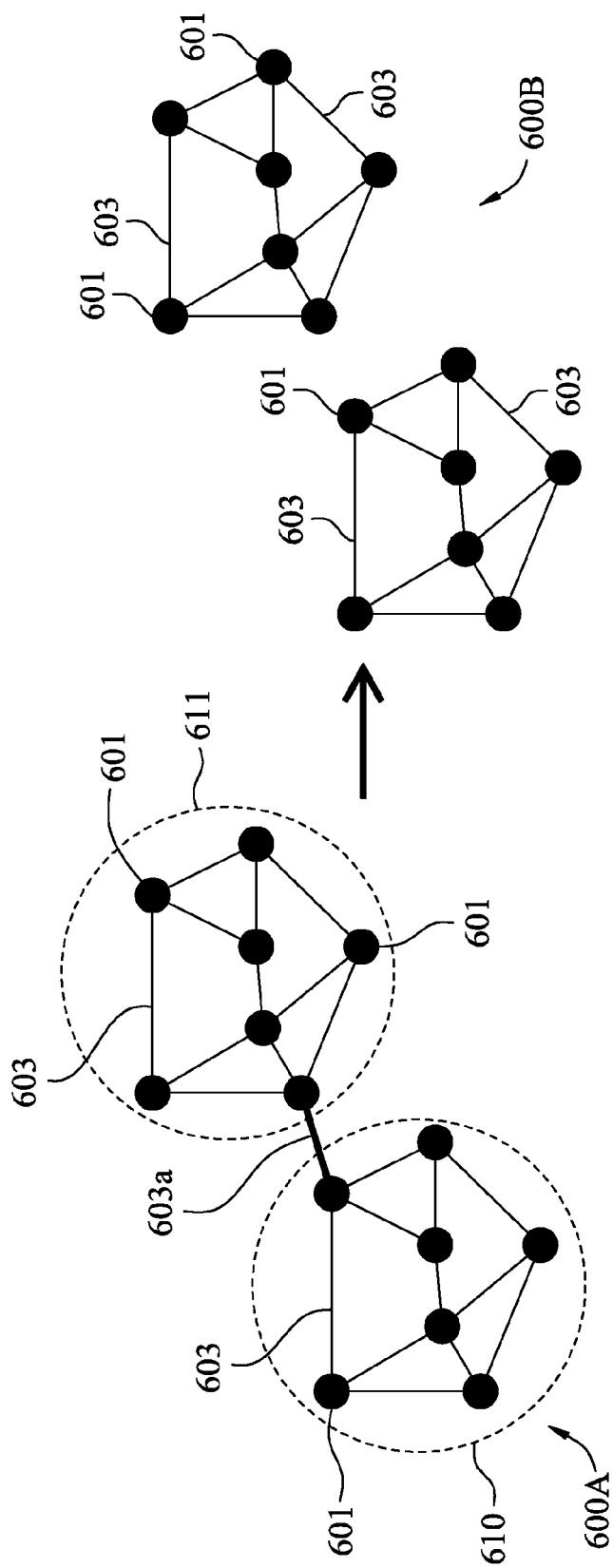
FIG. 6 illustrates another method for simplifying a conflict graph to determine decomposition validation in accordance with various embodiments of the present disclosure.

Referring now to FIG. 6, conflict graph 600A includes conflict graph portions 610 and 611. Vertices 601 and edges 603 represent the vertices and edges as described above. In FIG. 6, conflict graph portions 610 and 611 are separated only by edge 603a. According to some embodiments of the disclosure, a simplified conflict graph is produced by partitioning portions of the conflict graph that are connected by only a single edge. According to this embodiment, conflict graph portions 610 and 611 are partitioned by removing edge 603a to produce simplified conflict graph 600B as also shown in FIG. 6. Simplified conflict graph 600B shown in FIG. 6 may then be further simplified by another method of the disclosure, or evaluated for decomposition evaluation.

Figure 7:
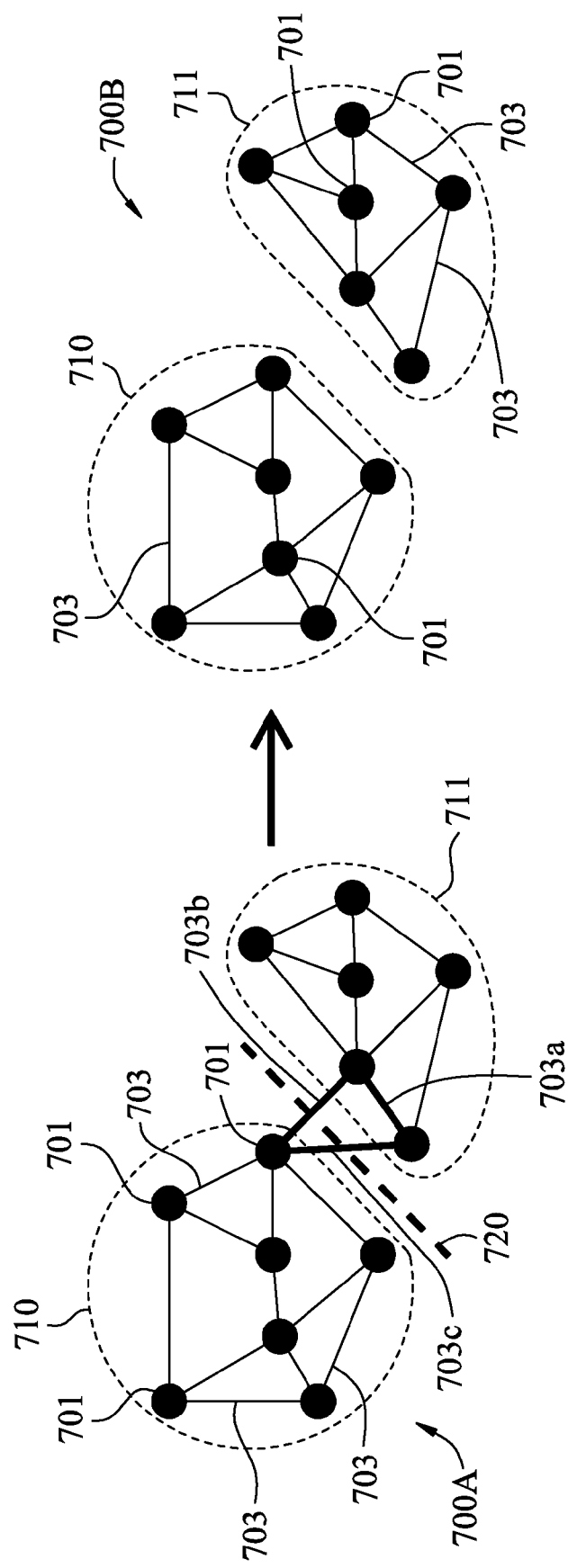
FIG. 7 illustrates another method for simplifying a conflict graph to determine decomposition validation in accordance with various embodiments of the present disclosure.

Referring now to FIG. 7, conflict graph 700A includes vertices 701 and edges 703. Vertices 701 and edges 703 represent the vertices and edges as described above. Conflict graph 700A includes conflict graph portions 710 and 711. Conflict graph portions 710 and 711 are joined only by a loop formed of edges 703a, 703b and 703c. According to some embodiments, the disclosure provides for partitioning the conflict graph portions that are connected only by a single loop. According to this embodiment, conflict graph portions 710 and 711 are partitioned along (dashed) partition line 720 to produce simplified conflict graph 700B that includes conflict graph portions 710 and 711. Simplified conflict graph 700B is then evaluated for decomposition validation or it may be further simplified by another method of the disclosure.

Figure 8:
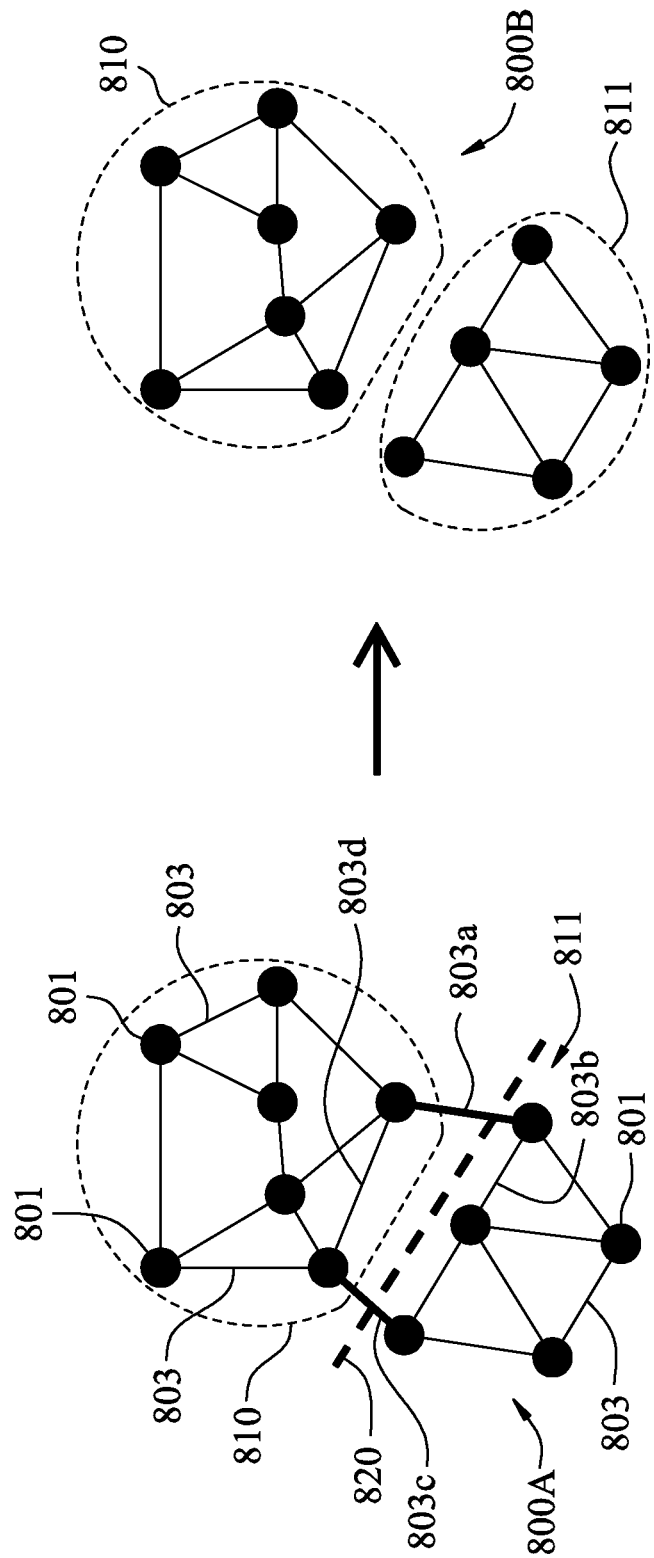
FIG. 8 illustrates another method for simplifying a conflict graph to determine decomposition validation in accordance with various embodiments of the present disclosure.

FIG. 8 shows another embodiment whereby two conflict graph portions are partitioned when the conflict graph portions are coupled by only a single loop. FIG. 8 shows conflict graph 800A and partition line 820. Partition line 820 bifurcates conflict graph 800A into conflict graph portions 810 and 811. Conflict graph 800A includes vertices 801 and edges 803, the vertices and edges as described above. Conflict graph 800A includes conflict graph portions 810, 811 that are separated only by a loop defined by edges 803a, 803b, 803c, and 803d. According to embodiments of the disclosure, conflict graph portions 810 and 811 are partitioned along partition line 820 to produce simplified conflict graph 800B. Simplified conflict graph 800B includes separated conflict graph portions 810 and 811. Simplified conflict graph 800B can then be more easily evaluated and it can be determined if simplified conflict graph 800B can be validly decomposed into three masks. In some embodiments, simplified conflict graph 800B is further simplified by another method of the disclosure prior to the decomposition validation according to various embodiments of the disclosure.

Figure 9:
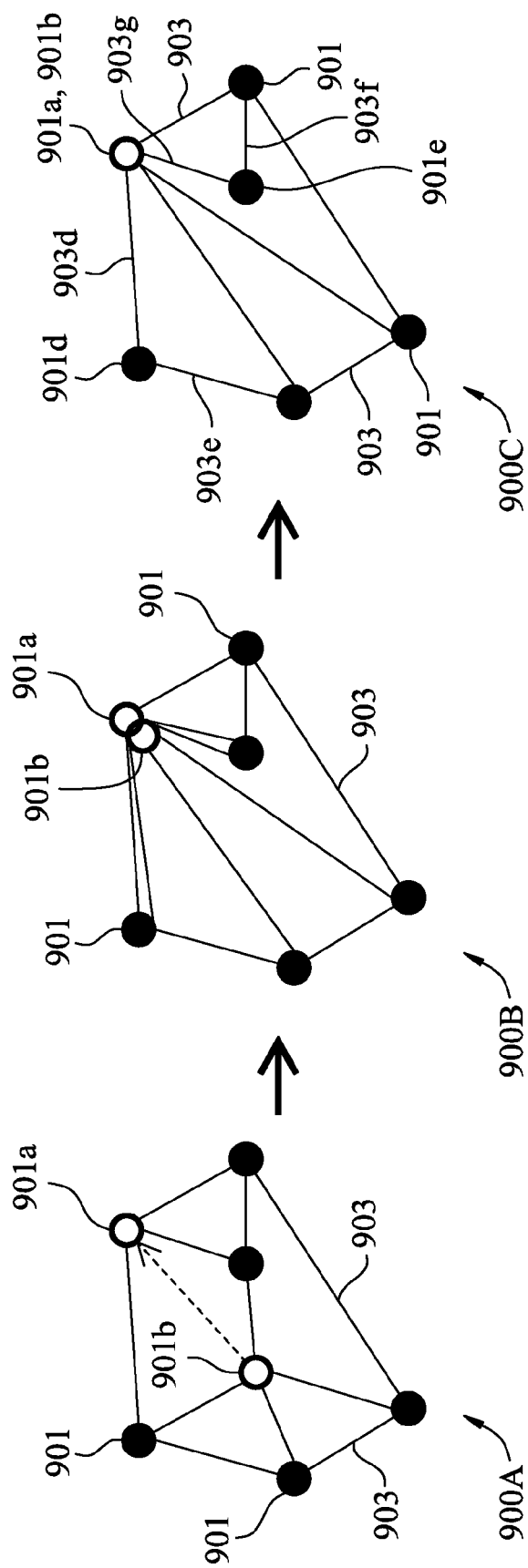
FIG. 9 illustrates another method for simplifying a conflict graph to determine decomposition validation in accordance with various embodiments of the present disclosure.

Referring now to FIG. 9, conflict graph 900A includes vertices 901 and edges 903. Vertices and edges are described above. According to embodiments of the disclosure, two vertices of a conflict graph are designated to be formed on the same photomask, and combined. The vertices 901 are evaluated to determine if combining two combinable vertices will simplify the conflict graph. Once two vertices are combined, the edges coupled to the combined vertex remain coupled to the now-combined vertex as shown in FIG. 9. According to this embodiment, vertices 901a and 901b are assigned to the same photomask and combined as indicated by the dashed arrow. Intermediate conflict graph 900B shows an intermediate step in the combination process and simplified conflict graph 900C shows vertices 901a and 901b combined to produce a simplified conflict graph 900C.

Simplified conflict graph 900C now includes two vertices 901*d* and 901*e* that are connected to the conflict graph by two or fewer edges 903. Vertex 901*d* is only connected to simplified conflict graph 900C by edges 903*e* and 903*d* and vertex 901*e* is only connected to simplified conflict graph 900C by edges 903*f* and 903*g*. Each of vertices 901*d* and 901*e* that are connected to the conflict graph by two or fewer edges, can then be removed from simplified conflict graph 900C to form a more simplified conflict graph, according to methods shown in FIG. 2. Simplified conflict graph 900C is then evaluated for decomposition validation or it may be simplified even further according to other methods of the disclosure.

Now referring to FIG. 10, conflict graph 1000A includes vertices 1001 and edges 1003, the vertices and edges as described above. Conflict graph 1000A includes partitioning line 1020. According to some aspects of the disclosure, portions of a conflict graph that are abutted only by even loops are partitioned to produce a simplified conflict graph that can be more easily evaluated for decomposition. Conflict graph 1000A includes two even loops, labeled as such. An even loop is a loop that includes an even number of vertices. Conflict graph 1000A includes an even first loop formed of edges 1003*a*, 1003*b*, 1003*c* and 1003*d*. Conflict graph 1000A includes another even loop defined by edges 1003*d*, 1003*e*, 1003*f*, and 1003*g*. According to aspects of the disclosure, the conflict graph 1000A is partitioned by partitioning across the even loops, i.e. by separating along partition line 1020, to produce simplified conflict graph 1000B. Simplified conflict graph 1000B may be further simplified by another method of the disclosure or may be used to determine if the conflict graph 1000B is decomposable into three masks for TPL.

FIG. 11 shows another embodiment in which portions of a conflict graph abutted by only even loops, are separated from one another to form a simplified conflict graph. Conflict graph 1100A includes vertices 1101 and edges 1103, the vertices and edges as described above. Partitioning line 1120 shows how conflict graph 1100A is simplified by partitioning into two separate conflict graphs when portions of the conflict graph 1100A are abutted by only even loops. Conflict graph 1100A includes even loops 1122, 1124 and 1126 that are further labeled "even" in FIG. 11. According to some embodiments of the disclosure, conflict graph 1100A is partitioned along the abutting even loops 1122, 1124, 1126 and partition line 1120, to form a separated and simplified conflict graph such as simplified conflict graph 1100B. According to some embodiments, vertices 1101*a* and 1101*b* are retained in each of simplified conflict graph portions 1110 and 1111. The simplified conflict graph 1100B may then be evaluated for decomposition validation or further simplified in accordance with another method of the disclosure.

It should be understood that the aforementioned methods for simplifying a conflict graph can be used in conjunction with one another and more than one time. According to some embodiments, one of the methods previously described is performed first and then one or more of the other methods is performed sequentially after the first method to continue to simplify the conflict graph.

Figure 12:
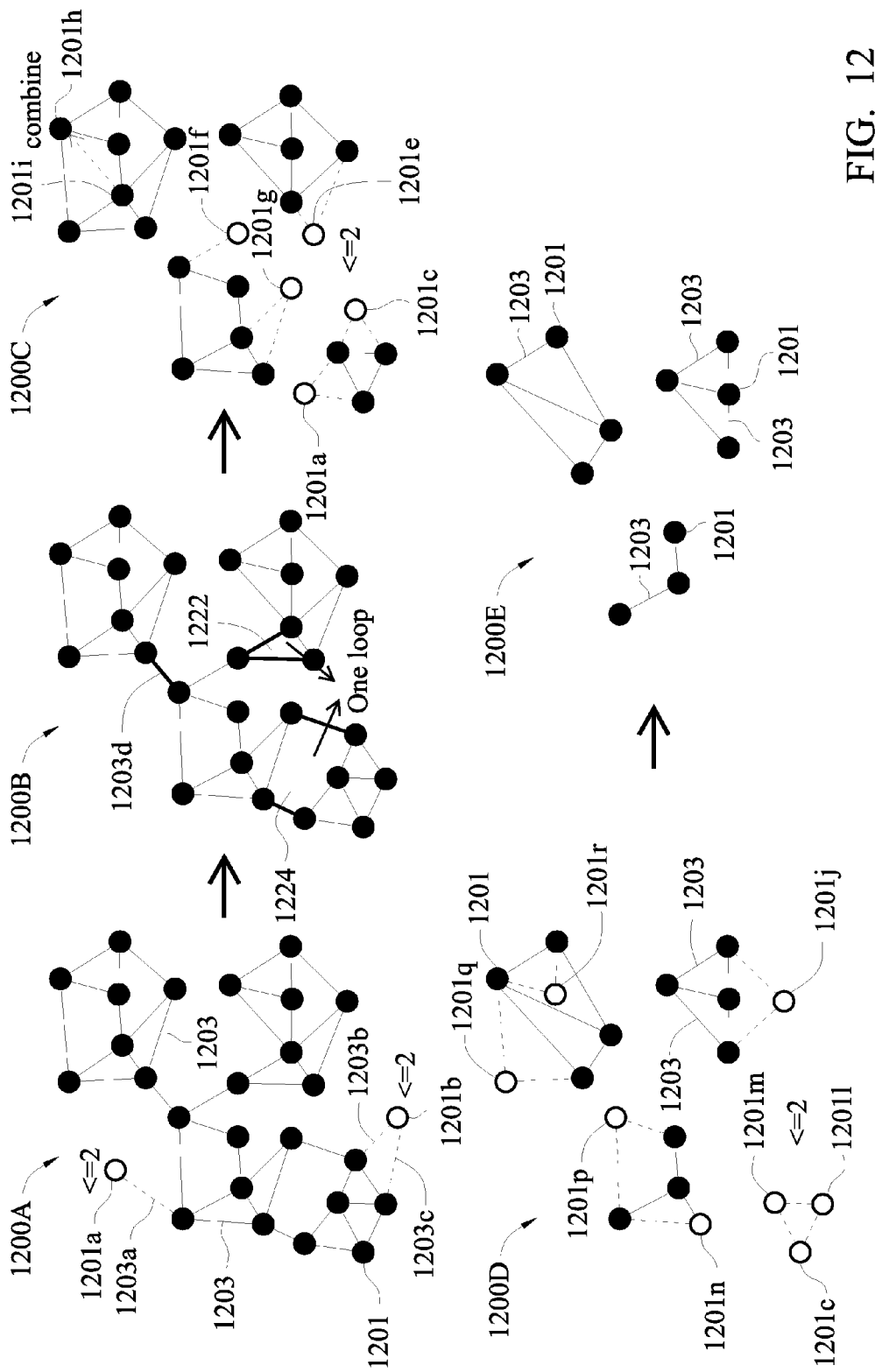
FIG. 12 shows a sequence of successive operations performed upon a conflict graph to produce a simplified conflict graph in accordance with various embodiments of the present disclosure.

FIG. 12 shows a series of conflict graph simplification steps carried out in sequence according to one embodiment of the disclosure. Conflict graph 1200A includes vertices 1201 and edges 1203, the vertices and edges as described above. In FIG. 12, conflict graph 1200A is first simplified by removing the two vertices 1201*a*, 1201*b* that are coupled to conflict graph 1200*a* by two or fewer edges 1203. Vertex 1201*a* is coupled to conflict graph 1200A by only edge 1203*a* and vertex 1201*b* is coupled to conflict graph 1200A by only edges 1203*b* and 1203*c*. Conflict graph 1200A is thus simplified to form simplified conflict graph 1200B.

In simplified conflict graph 1200B, portions of the conflict graph are partitioned using previously discussed techniques. Edge 1203*d* is removed to partition simplified conflict graph 1200B into two portions. The portion of simplified conflict graph 1200B that is joined to the rest of simplified conflict group 1200B by only single loop 1222 is also partitioned off. The portion of simplified conflict graph 1200B that is only joined the rest of simplified conflict graph 1200B by loop 1224 is also separated by partitioning. The partitioned portions of simplified conflict graph 1200B now appear as simplified conflict graph 1200C. The simplified conflict graph 1200C is further simplified as vertices 1201*c*, 1201*d*, 1201*e*, 1201*f* and 1201*g* each represent a vertex coupled to the simplified conflict graph 1200C by two or fewer edges and are removed from simplified conflict graph 1200C. Vertices 1201*h* and 1201*i* of simplified conflict graph 1200C are assigned the same photomask and combined such as described in conjunction with the embodiment presented in FIG. 9. Simplified conflict graph 1200C is thereby further simplified to produce simplified conflict graph 1200D. Simplified conflict graph 1200D is then further simplified by removing any vertex 1201 coupled to simplified conflict graph 1200D by two or fewer edges. It can be seen that vertices 1201*j*, 1201*k*, 1201*l*, 1201*m*, 1201*n*, 1201*p*, 1201*q*, and 1201*r* are each coupled to simplified conflict graph 1200D by two or fewer edges and each of these vertices are then removed from simplified conflict graph 1200D to produce further simplified conflict graph 1200E. Further simplified conflict graph 1200E can now be evaluated for decomposition validation or can be further simplified according to other methods of the present disclosure.

After the conflict graphs are converted to simplified conflict graphs according to aspects of the disclosure described above, the simplified conflict graph is analyzed to see if the conflict graph can be decomposed into three photomasks for triple patterning lithography or if there are conflicts that prevent the decomposition. The analysis is carried out by a computer or various other processors according to various embodiments of the disclosure. Various computers and processors may be used. In some embodiments of the disclosure, a computer program product includes instructions stored on a non-transitory, tangible machine readable storage media. When these instructions are executed by a computer, the computer performs the aforementioned steps and methods.

Figure 13:
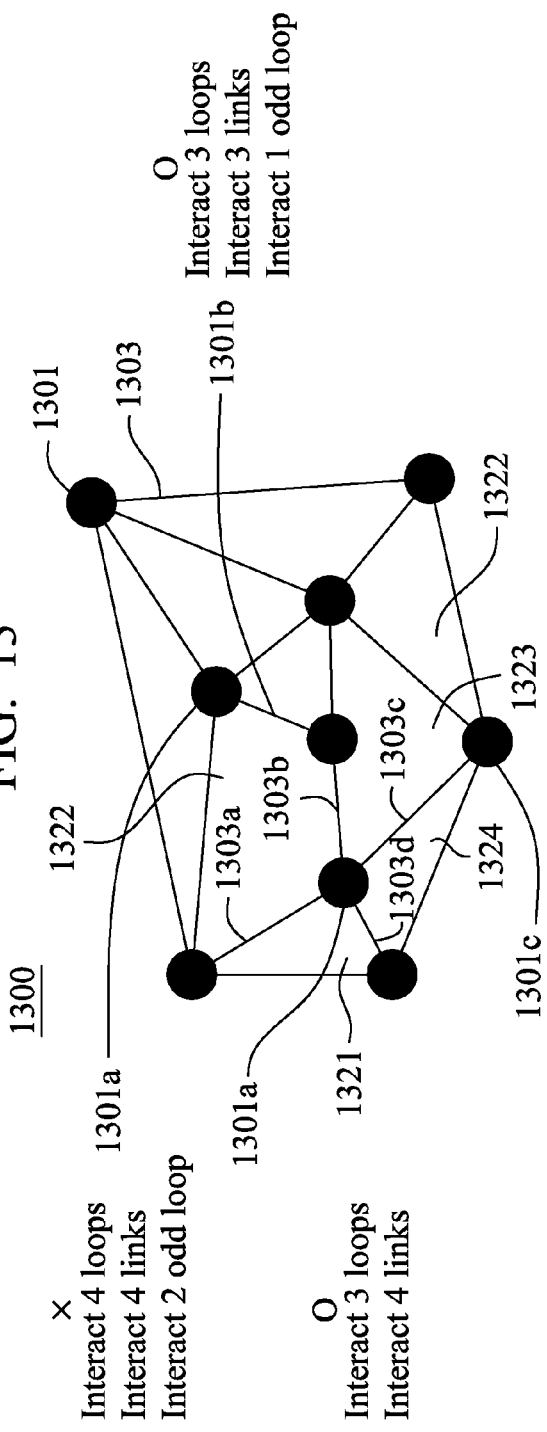
FIG. 13 is a conflict graph in accordance with various embodiments of the present disclosure.

Now referring to FIG. 13, conflict graph 1300 includes vertices 1301 and edges 1303, the vertices and edges as described above. According to one embodiment for determining whether a conflict graph is decomposable, the vertices 1301 of the conflict graph are each evaluated. If one or more vertices 1301 violates a rule against valid decomposition and no exception conditions apply, then the conflict graph is not decomposable into the three masks for TPL.

According to some embodiments, one exception condition is when the vertex in question is coupled to one or fewer odd loops.

For example, if one or more vertices 1301 is included in a number of loops that is greater than or equal to the number of edges to which the vertex is coupled, then the conflict graph is not decomposable unless an exception condition applies. For example, vertex 1301*a* is coupled to four edges 1303*a*, 1303*b*, 1303*c*, and 1303*d*. Vertex 1301*a* is also part of four loops including loop 1321, loop 1322, loop 1323, and loop 1324. This violates a rule against valid decomposition because according to one embodiment, a conflict graph is not decomposable into three photomasks for TPL if there are any vertices that are included in a number of loops greater or equal to the number of links to which the vertex is coupled, unless an exception condition exists. According to some embodiments, one exception condition is when the vertex in question is coupled to one or fewer odd loops. According to this exception, a conflict graph that includes a vertex coupled to a number of links equal to the number of loops that include the vertex, and which would be otherwise decomposable, is decomposable if the vertex in question is coupled to one or fewer odd loops. For vertex 1301a, no exception condition exists because two of the loops (loops 1321, and 1324) are odd loops so vertex 1301a is not coupled to one or fewer odd loops. Vertex 1301d is also coupled to four edges and vertex 1301d is also part of four loops. This violates a rule against valid decomposition because vertex 1301d is coupled to a number of links equal to the number of loops that includes vertex 1301d and no exception condition exists because vertex 1301d is coupled to two odd loops.

Still referring to FIG. 13, vertex 1301b interacts with three edges 1303 and forms a part of three loops. Because vertex 1301b interacts with the same number of edges (three) equal to the number of loops (three) that include vertex 1301b, vertex 1301b would violate the rule against decomposition but an exception condition applies, the exception condition being that vertex 1301b is only coupled to one loop, i.e. loop 1331 with an odd number of vertices, i.e. an "odd loop". Because an exception condition applies, vertex 1301b is not in violation of any decomposition rules and would not prevent conflict graph 1300 from being decomposed. Vertex 1301c does not violate the above stated rule against decomposition because vertex 1301c interacts with four edges 1303 but is only included in three loops. More particularly, vertex 1301c only interacts with loops 1322, 1323 and 1324. Since the number of loops that vertex 1301c interacts with (3) is less than the number of links (4) that vertex 1301c interacts with, it does not violate the above-stated rule and vertex 1301c does not present a condition that would invalidate decomposition.

According to another exception condition to the above rule, a "wheel graph" which would otherwise not be decomposable because the center vertex is coupled to a number of links equal to the number of loops that include the center vertex, is decomposable if the wheel graph includes an odd number of vertices.

A "wheel graph" is a conflict graph portion that includes a center vertex and multiple peripheral vertices. Each peripheral vertex is coupled to the adjacent peripheral vertex by a single edge. The center vertex is coupled to each of the peripheral vertices by a single edge producing a spoke-like "wheel graph" that includes a center vertex such as vertex 1403a in FIG. 13A that is coupled to each of the peripheral vertices 1403 by an associated edge 1413. This produces a "wheel graph" in which the center vertex 1403a interacts with a number of links (five) equal to the number of loops (five) that include center vertex 1403a in wheel graph W6 of FIG. 13A.

Figure 13D:
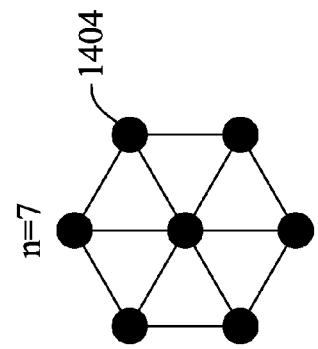
FIG. 13D is a wheel graph that is decomposable, in accordance with various embodiments of the present disclosure.
Figure 13A:
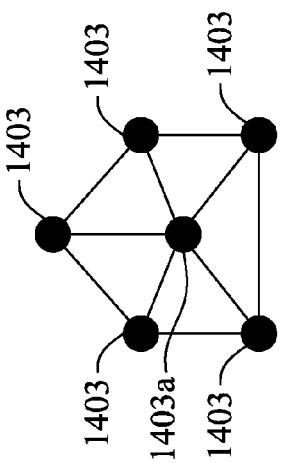
FIG. 13A is a wheel graph that is not decomposable, in accordance with various embodiments of the present disclosure.

FIG. 13A shows wheel graph W6 which is not decomposable because there are six vertices 1401 in the wheel graph W6. The conflict graph represented by wheel graph W6 is not decomposable because a) center vertex 1403a interacts with five edges and five loops and is in violation of the above-stated rule and b) wheel graph W6 includes an even number (six) of total vertices 1401 and therefore no exception condition applies. The conflict graph illustrated by wheel graph W4 in FIG. 13B is also not decomposable because it includes an even number (4) of vertices 1401. Wheel graphs W4 and W6 contain even numbers of vertices and therefore do not present an exception condition.

Figure 13C:
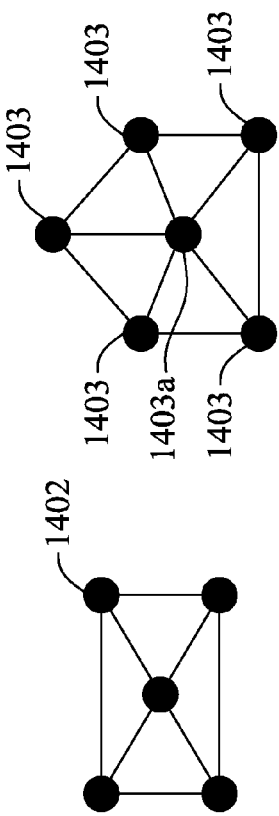
FIG. 13C is a wheel graph that is decomposable, in accordance with various embodiments of the present disclosure.
Figure 13B:
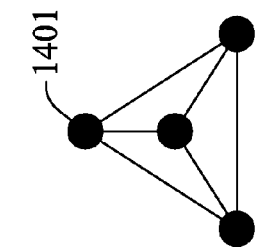
FIG. 13B is a wheel graph that is not decomposable, in accordance with various embodiments of the present disclosure

The conflict graphs represented by wheel graphs W5 in FIG. 13C and wheel graph W7 in FIG. 13D are decomposable because they include an odd number of vertices and present an exception condition to the above rule. Wheel graph W5 includes five vertices 1402 and wheel graph W7 includes seven vertices 1404. As above, Applicants have found that a wheel graph that includes an even total number of vertices is not decomposable but a wheel graph with an odd number of total vertices is decomposable because it presents an exception condition to the rule stated above.

Figure 14:
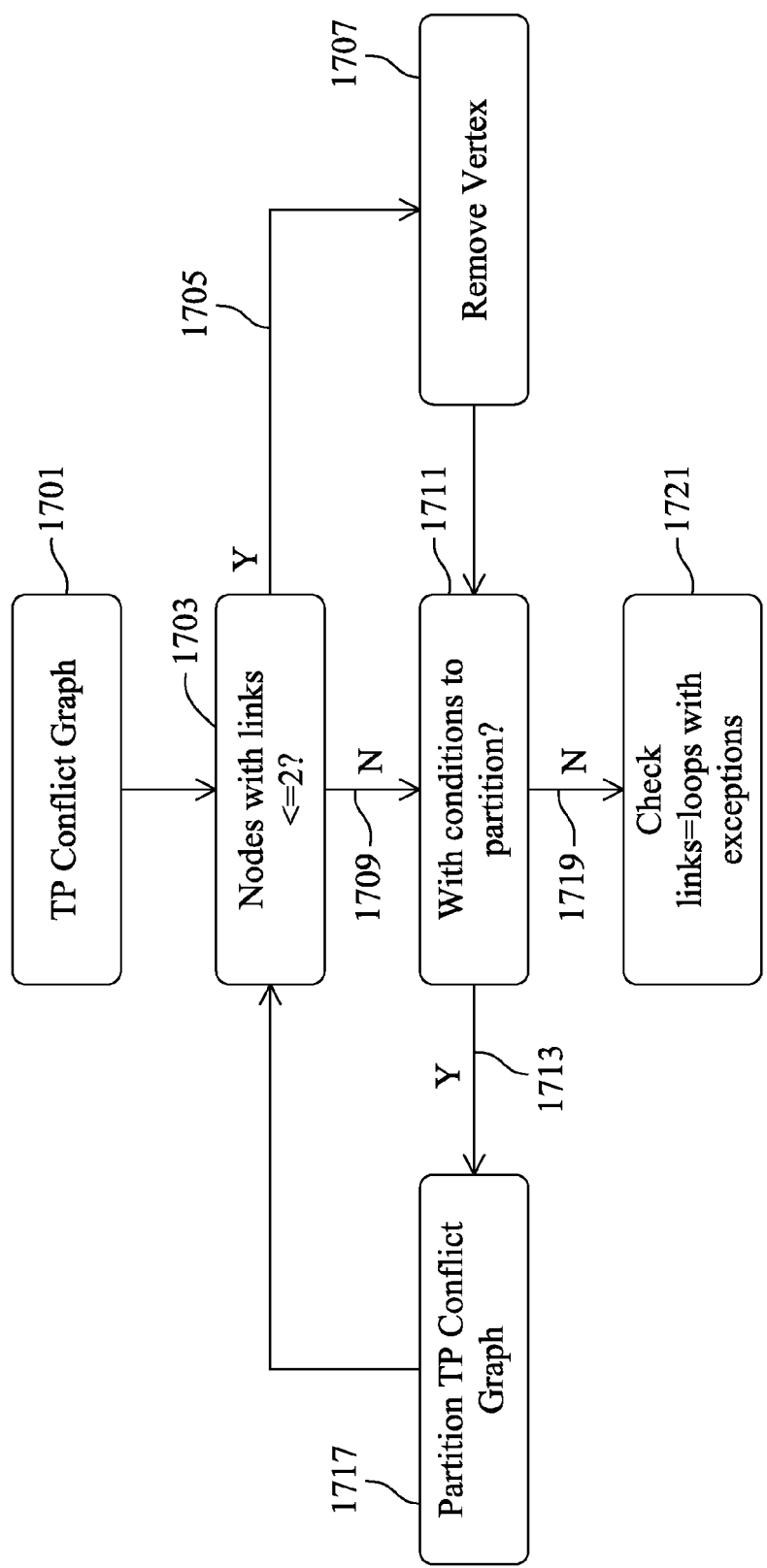
FIG. 14 is a flowchart illustrating a method for simplifying a conflict graph to determine decomposition validity and for applying rules to the simplified conflict graph for decomposition.

FIG. 14 is a flow chart illustrating a method according to aspects of the disclosure. A triple patterning conflict graph is generated at step 1701. At step 1703, the conflict graph is analyzed to see if there are vertices coupled to the conflict graph by two or fewer edges. If yes 1705, these vertices are removed at step 1707. If no 1709, or after the vertices are removed at step 1707, the method proceeds to step 1711. At step 1711, the conflict graph is analyzed to see if conditions exist such that portions of the conflict graph can be partitioned according to any of the various methods described above. If yes 1713, the conflict graph is partitioned at step 1717. After partitioning at step 1717, the method continues with the simplified conflict graph being again analyzed at step 1703 to see if further vertices can be removed because they are coupled to two or fewer edges. If no 1719, the simplified conflict graph is evaluated at step 1721. At step 1721, each vertex is evaluated and if one or more vertices violates a rule against decomposition and an exception condition does not apply, the conflict graph cannot be decomposed into three photomasks.

It should be pointed out that the aforementioned steps including the generation of the conflict graph, the simplification of the conflict graph according to the various methods of the disclosure, the analysis of the conflict graph to determine validity of decomposition and the decomposition of the components of the conflict graph into three masks may be carried out by a computer or other suitable processor according to various embodiments of the disclosure. The present disclosure also includes a computer program product for decomposing a layout for triple pattern lithography. The computer program product includes instructions stored on a non-transitory, tangible machine readable storage media that, when executed by a computer or other processor, generates a conflict graph from the layout and carries out the other computer steps described above.

According to some embodiments, a method of decomposing a layout for triple-pattern lithography, is provided. The method includes: generating a conflict graph from a layout for a device level of a semiconductor device, the conflict graph including a plurality of nodes, each node representing a polygon of the layout, and a plurality of links, each connecting two nodes. Each link corresponds to a distance between adjacent polygons being less than a minimum separation distance using a single photomask. The method also includes converting the conflict graph to a simplified conflict graph, the converting including removing nodes that are connected to two or fewer links, from the conflict graph. At least one of the generating and converting steps is carried out by a computer.

According to some embodiments, a method for decomposing a layout for triple-pattern lithography. The method includes generating a conflict graph from a layout of a device level of a semiconductor device, the conflict graph including a plurality of nodes, each node representing a polygon of the layout, and a plurality of links, each connecting two of the nodes. Each link corresponds to a distance between adjacent polygons being less than a minimum separation distance using a single photomask. The method also includes converting the conflict graph to a simplified conflict graph; and analyzing the simplified conflict graph and applying at least one rule to the simplified conflict graph to determine if the layout is decomposable into three photomasks. At least one of the generating, converting and analyzing steps is carried out by a computer.

According to some embodiments, a non-transitory machine readable storage medium is provided. The non-transitory machine readable storage medium is encoded with computer program code, such that when the computer program code is executed by a processor, the processor performs a method including: generating a conflict graph from a layout for a device level of a semiconductor device, the conflict graph including a plurality of nodes, each node representing a polygon of the layout and a plurality of links connecting two the nodes. Each link corresponds to a distance between adjacent polygons being less than a minimum separation distance using a single photomask. The method further includes converting the conflict graph to a simplified conflict graph, the converting including at least one of a) removing one or more of the nodes from the conflict graph that are connected to two or fewer of the links and b) partitioning portions of the conflict graph connected by a single link of the links. At least one of the generating and converting steps is carried out by a computer.

In this document, the terms "computer program product", "computer-readable medium", and the like, may be used generally to refer to media such as, memory storage devices, or storage unit. These, and other forms of computer-readable media, may be involved in storing one or more instructions for use by processor to cause the processor to perform specified operations. Such instructions, generally referred to as "computer program code" (which may be grouped in the form of computer programs or other groupings), when executed, enable the computing system.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments, which may be made by those skilled in the art without departing from the scope and range of equivalents of the disclosure.

What is claimed is:

1. A computing system comprising:
    a computer processor; and
    a non-transitory machine readable storage medium encoded with computer program code, the computer program code when executed causing the computer processor to perform operations comprising:
    generating a conflict graph from a layout for a layer of a semiconductor device, said conflict graph including:
        a plurality of nodes, each node representing a polygon of said layout, and
        a plurality of links, each link connecting two of said nodes and corresponding to a distance between adjacent polygons, the distance being less than a minimum inter-pattern separation distance using a single photomask; and
    converting said conflict graph to a simplified conflict graph, wherein said converting comprises:
        determining when portions of said conflict graph are connected only by one or more even loops, and
        based on said determining, partitioning said portions of said conflict graph connected only by said one or more even loops, each of said one or more even loops comprising a loop with an even number of nodes;
    wherein the computer is configured to output mask assignment data based on the simplified conflict graph indicating that the layout is decomposable for triple pattern lithography, and the mask assignment data are used to fabricate at least one photomask for patterning the layer of the semiconductor device.

2. The computing system of claim 1, wherein said partitioning comprises partitioning along a partition boundary that does not include any of said nodes.

3. The system of claim 2, wherein said simplified conflict graph does not include any edges of said conflict graph that intersect said partition boundary.

4. The computing system of claim 1, wherein said partitioning comprises partitioning along a partition boundary that includes at least one of said nodes.

5. The system of claim 4, wherein said simplified conflict graph does not include any edges of said conflict graph that intersect said partition boundary.

6. The system of claim 1, wherein said one or more even loops includes a plurality of even loops.

7. A method comprising:
    generating a conflict graph from a layout for a layer of a semiconductor device, said conflict graph including:
        a plurality of nodes, each node representing a polygon of said layout, and a plurality of links, each link connecting two of said nodes and corresponding to a distance between adjacent polygons, the distance being less than a minimum inter-pattern separation distance using a single photomask; and converting said conflict graph to a simplified conflict graph, said converting comprising:

separating portions of said conflict graph that are connected by only a single loop, assigning two nodes to a first photomask, wherein a path exists in said conflict graph between said two nodes, and combining said two nodes;

wherein at least one of said generating and said converting is performed by a computer, and the computer outputs mask assignment data based on the simplified conflict graph indicating whether the layout can be decomposed for triple pattern lithography, and the mask assignment data are used to fabricate at least one photomask for patterning the layer of the semiconductor device.

8. The method of claim 7, wherein said converting further comprises partitioning portions of said conflict graph that are connected by only a single link of said links, and said partitioning is performed after said separating.

9. The method of claim 7, wherein said converting further comprises at least one of a) removing nodes that are connected to two or fewer of said links, from said conflict graph after said separating or b) partitioning portions of said conflict graph that are connected by only a single one of said links after said separating.

10. The method of claim 7, wherein said converting further comprises partitioning portions of said conflict graph connected by only even loops after said separating, wherein said even loop comprises a loop with an even number of nodes.

11. The method of claim 10, wherein said converting further comprises at least one of a) removing nodes that are coupled to two or fewer of said links, from said conflict graph after said partitioning or b) further partitioning portions of said conflict graph that are connected by only a single one of said links after said partitioning.

12. The method of claim 7, wherein said converting further comprises partitioning portions of said conflict graph connected by one of a) only a single link of said links or b) only even loops, wherein each said even loop comprises a loop with an even number of nodes.

13. The method of claim 7, further comprising analyzing said simplified conflict graph to determine if said layout is decomposable into three photomasks.

14. The method of claim 13, further comprising decomposing said layout into three photomasks.

15. The method of claim 13, wherein said analyzing said simplified conflict graph includes applying a rule that said layout is not decomposable into three photomasks if said simplified conflict graph includes a first node of said plurality of nodes forming part of a number of loops equaling or exceeding a number of links to which said first node is coupled, unless an exception condition is met.

16. A method comprising:

generating a conflict graph from a layout for a layer of a semiconductor device, said conflict graph including:

a plurality of nodes, each node representing a polygon of said layout, and a plurality of links, each link connecting two of said nodes and corresponding to a distance between adjacent polygons, the distance being less than a minimum inter-pattern separation distance using a single photomask; and converting said conflict graph to a simplified conflict graph, wherein said converting comprises:

determining when portions of said conflict graph are connected only by one or more even loops, and based on said determining, partitioning said portions of said conflict graph connected only by said one or more even loops, each of said one or more even loops comprising a loop with an even number of nodes;

wherein at least one of said generating and said converting is performed by a computer configured to output mask assignment data based on the simplified conflict graph indicating that the layout is decomposable for triple pattern lithography.

17. The method of claim 16, wherein said partitioning comprises partitioning along a partition boundary that does not include any of said nodes.

18. The method of claim 16, wherein said partitioning comprises partitioning along a partition boundary that includes at least one of said nodes.

19. The method of claim 16, wherein said one or more even loops includes a plurality of even loops.

* * * * *